US012407366B2

(12) United States Patent
Shin et al.

(10) Patent No.: US 12,407,366 B2
(45) Date of Patent: Sep. 2, 2025

(54) CODING CIRCUIT AND MEMORY DEVICE INCLUDING THE SAME

(71) Applicants: SK hynix Inc., Icheon-si (KR); KOREA UNIVERSITY RESEARCH AND BUSINESS FOUNDATION, Seoul (KR)

(72) Inventors: Chaehyeon Shin, Seoul (KR); Jongsun Park, Seoul (KR); Munseon Jang, Icheon-si (KR)

(73) Assignees: SK hynix Inc., Icheon-si (KR); KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 27 days.

(21) Appl. No.: 18/620,595

(22) Filed: Mar. 28, 2024

(65) Prior Publication Data

US 2025/0175195 A1 May 29, 2025

(30) Foreign Application Priority Data

Nov. 27, 2023 (KR) .................. 10-2023-0166841

(51) Int. Cl.
*H03M 13/00* (2006.01)
*H03M 13/11* (2006.01)

(52) U.S. Cl.
CPC .... *H03M 13/1148* (2013.01); *H03M 13/1105* (2013.01)

(58) Field of Classification Search
CPC ......... H03M 13/1105; H03M 13/2942; H03M 13/1174; H03M 13/611
See application file for complete search history.

(56) References Cited

U.S. PATENT DOCUMENTS

| | | | | |
|---|---|---|---|---|
| 5,856,987 A * | 1/1999 | Holman | ............... | H03M 13/151 714/752 |
| 7,530,008 B2 * | 5/2009 | Das | ................... | H03M 13/1575 714/784 |
| 10,725,841 B1 * | 7/2020 | Rahul | ................. | H03M 13/618 |
| 10,761,927 B2 * | 9/2020 | Lu | ....................... | G06F 11/1012 |
| 10,949,298 B2 * | 3/2021 | Lu | ....................... | G06F 11/1048 |
| 11,314,587 B2 * | 4/2022 | Lu | ......................... | H03M 13/05 |

(Continued)

FOREIGN PATENT DOCUMENTS

KR    10-2021-0080807 A    7/2021

OTHER PUBLICATIONS

Hsinchun Chen et al., "Business intelligence and analytics: From big data to big impact," MIS quarterly, 2012, pp. 1165-1188, vol. 36, No. 4.

(Continued)

*Primary Examiner* — Esaw T Abraham

(57) ABSTRACT

A coding circuit includes an encoder circuit that generates parity by applying input data to a parity generating matrix and generate input codeword by concatenating the input data and the parity, and a decoder circuit that detects and corrects an out-of-boundary 2-bit error using syndromes. The out-of-boundary 2-bit error corresponds to two 1-bit errors occurred at two symbols respectively among a plurality of symbols included in output codeword, and the syndromes are generated by applying the output codeword to the parity generating matrix.

20 Claims, 12 Drawing Sheets

(56) References Cited

U.S. PATENT DOCUMENTS 11,462,292 B1 * 10/2022 Kim ............... H03M 13/1168
11,711,100 B2 * 7/2023 Uchikawa .......... H03M 13/159
                          714/758

OTHER PUBLICATIONS

"Main Memory: DDR4 & DDR5 SDRAM," 2020, web page: https://web.archive.org/web/20200329090755/http://www.jedec.org/join-jedec.

Shekhar Borkar et al., "Parameter variations and impact on circuits and microarchitecture," the 40th annual Design Automation Conference, 2003.

Dongkyun Kim et al., "A 1.1-V 10-nm Class 6.4-GB/s/Pin 16-GB DDR5 SDRAM With a Phase Rotator-ILO DLL, High-Speed SerDes, and DFE/FFE Equalization Scheme for Rx/Tx," IEEE Journal of Solid-State Circuits, Jan. 2020, pp. 167-177, vol. 55, No. 1.

I.S. Reed et al., "Polynomial Codes over Certain Finite Fields," J.SIAM, Jun. 1960, pp. 300-304, vol. 8, No. 2.

Myeong-Jae Park et al., "A 192-GB 12-High 896-GB/s HBM3 DRAM with a TSV Auto-Calibration Scheme and Machine-Learning-Based Layout Optimization," 2022 IEEE International Solid- State Circuits Conference (ISSCC), 2022, pp. 444-446, doi: 10.1109/ISSCC42614.2022.9731562.

Abhishek Das et al., "Systematic b-adjacent symbol error correcting reed-solomon codes with parallel decoding," 2018 IEEE 36th VLSI Test Symposium (VTS), 2018.

* cited by examiner

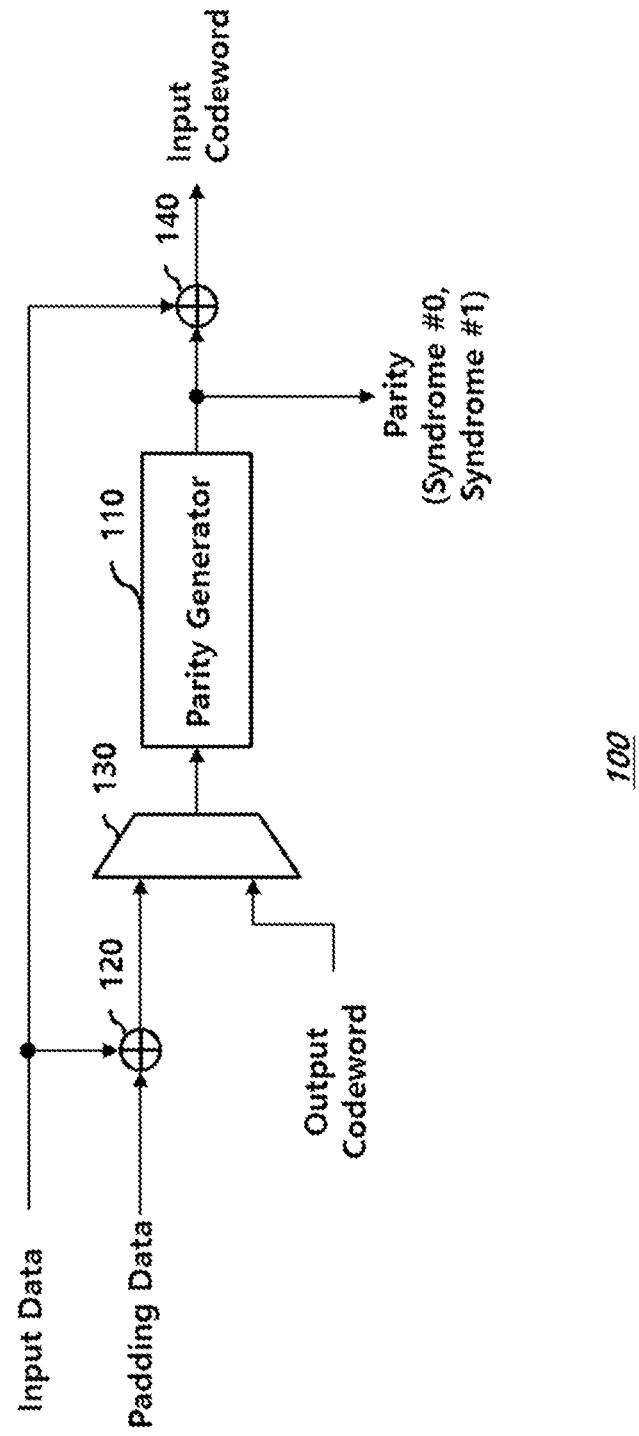

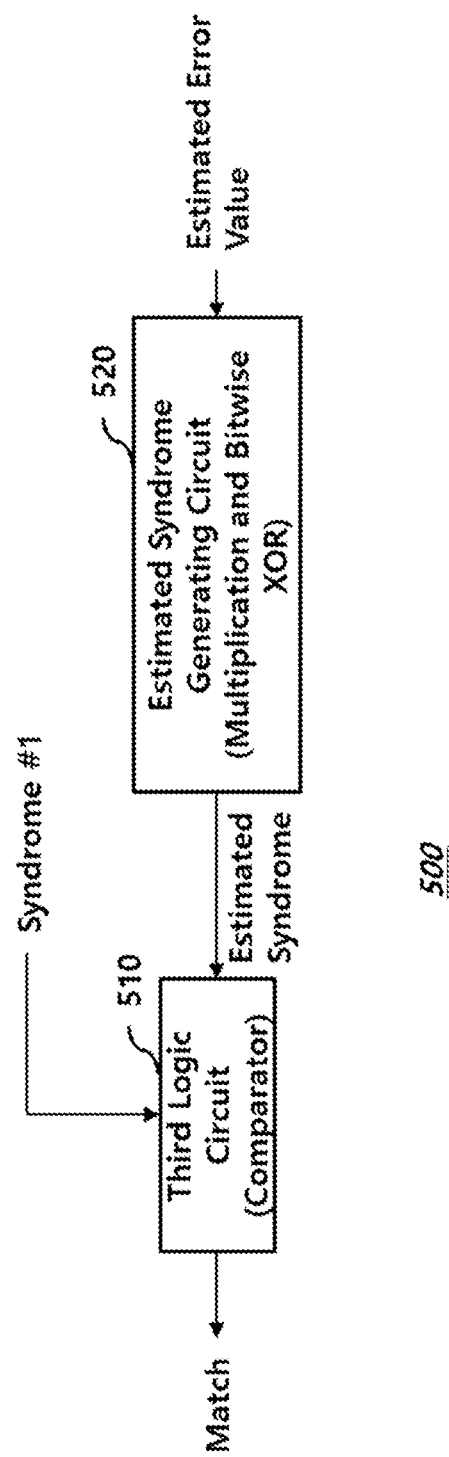

CODING CIRCUIT AND MEMORY DEVICE INCLUDING THE SAME

CROSS-REFERENCE TO RELATED APPLICATION

The present application claims priority under 35 U.S.C. § 119(a) to Korean Patent Application No. 10-2023-0166841, filed on Nov. 27, 2023, which is incorporated herein by reference in its entirety.

BACKGROUND

1. Technical Field

Various embodiments generally relate to a coding circuit and a memory device including the coding circuit, and more specifically to a coding circuit that corrects a 1-symbol/2-bit error without increasing parity bits and a memory device including the coding circuit.

2. Related Art

In order to reduce power consumption of memory devices and to improve bandwidth performance, processes are becoming more refined, thereby increasing the probability of errors occurring.

To resolve errors that have occurred, an in-memory error correction code that detects and corrects errors within the memory may be used.

A conventional 1-symbol correction Reed-Solomon (RS) code can correct a two-bit error occurring within one symbol boundary by using two parity symbols.

However, if a 2-bit error occurs beyond one symbol boundary, that is, if a 1-bit error occurs in each of two symbols, correction cannot be made with the conventional 1-symbol correction RS code.

In order to correct the 2-bit error that occurs exceeding one symbol boundary, an additional Bose-Chaudhuri-Hocquenghem (BCH) code can be applied, but an additional parity bit for the BCH code must be used and the area of the encoder circuit and decoder circuit for processing the BCH code may be increased. Accordingly, the total circuit area may increase excessively.

SUMMARY

In accordance with an embodiment of the present disclosure, a coding circuit may include an encoder circuit configured to generate parity by applying data to a parity generating matrix and generate input codeword by concatenating the input data and the parity; and a decoder circuit configured to detect and correct an out-of-boundary 2-bit error using syndromes, the out-of-boundary 2-bit error corresponding to two 1-bit errors occurred at two symbols respectively among a plurality of symbols included in output codeword, the syndromes generated by applying the output codeword to the parity generating matrix.

In accordance with an embodiment of the present disclosure, a memory device may include a memory cell array; and a coding circuit configured to provide input codeword to the memory cell array by encoding input data, and to generate output data and a detection signal by decoding output codeword output from the memory cell array, wherein the coding circuit includes an encoder circuit configured to generate parity by applying the input data to a parity generating matrix and generate the input codeword by concatenating the input data and the parity; and a decoder circuit configured to detect and correct an out-of-boundary 2-bit error using syndromes, the out-of-boundary 2-bit error corresponding to two 1-bit errors occurred at two symbols respectively among a plurality of symbols included in the output codeword, the syndromes being generated by applying the output codeword to the parity generating matrix.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate various embodiments, and explain various principles and advantages of those embodiments.

FIG. 2 illustrates an encoder circuit according to an embodiment of the present disclosure.

FIG. 11 illustrates a third error location detection circuit according to an embodiment of the present disclosure.

DETAILED DESCRIPTION

The following detailed description references the accompanying figures in describing illustrative embodiments consistent with this disclosure. The embodiments are provided for illustrative purposes and are not exhaustive. Additional embodiments not explicitly illustrated or described are possible. Further, modifications can be made to presented embodiments within the scope of teachings of the present disclosure. The detailed description is not meant to limit this disclosure. Rather, the scope of embodiments of the present disclosure are defined in accordance with claims and equivalents thereof.

Hereinafter, an embodiment will be described using a (19, 17) Reed-Solomon (RS) code, where one symbol includes 16 bits, as an example.

Here, (19, 17) represents that one codeword includes a total of 19 symbols comprising 17 symbols of data (or data symbols) or a message and 2 symbols of parity (or parity symbols).

That is, 17 data symbols consist of 272 bits, 2 parity symbols consist of 32 bits, and therefore one codeword consists of 304 bits.

The Galois field used in this example is denoted by $GF(2^{16})$ and is a finite field containing $2^{16}-1$ elements $\alpha^0$, $\alpha^1$, $\alpha^2$, ..., $\alpha^{65534}$. At this time, each element is 16-bit vector data.

Figure 1:
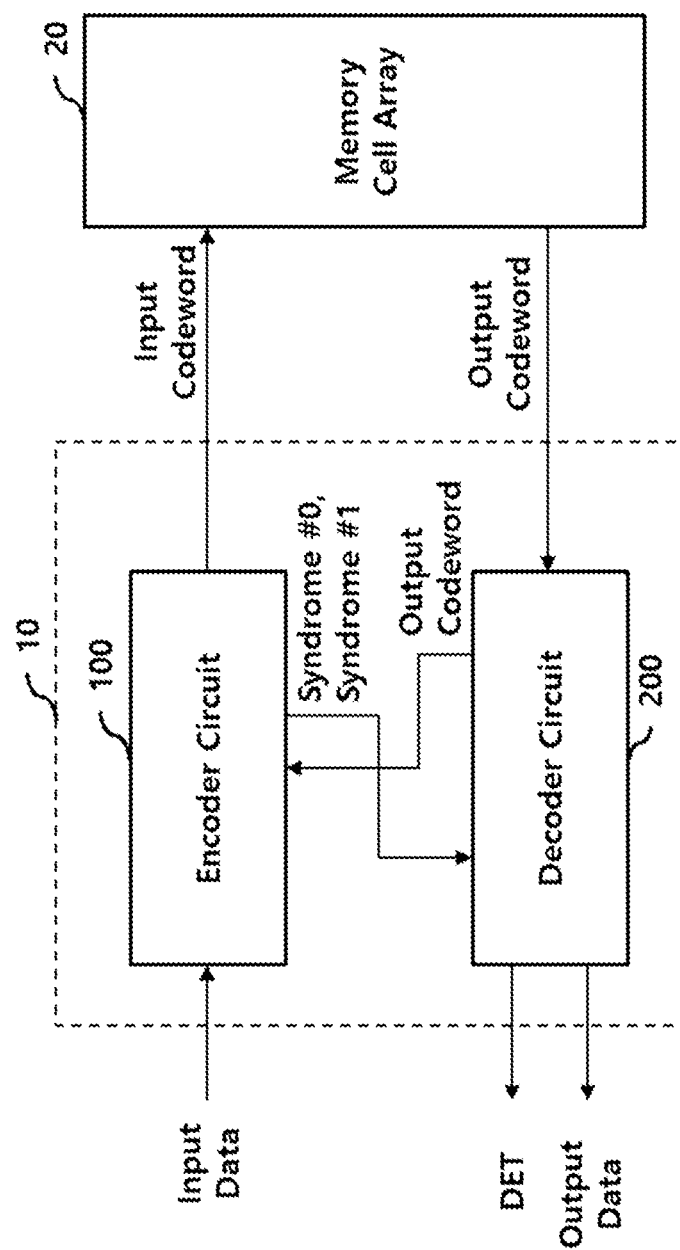
FIG. 1 illustrates a memory device according to an embodiment of the present disclosure.

FIG. 1 is a block diagram showing a memory device 1 according to an embodiment of the present disclosure.

The memory device 1 includes a coding circuit 10 and a memory cell array 20.

The memory cell array 20 stores an input codeword generated by the coding circuit 10 during a write operation and provides an output codeword output during a read operation to the coding circuit 10.

The coding circuit 10 includes an encoder circuit 100 that encodes input data to generate the input codeword, and a decoder circuit 200 that decodes the output codeword to generate the output data and a detection signal DET.

The coding circuit 10 processes a RS code. Therefore, the encoder circuit 100 may be referred to as a RS encoder circuit 100, and the decoder circuit 200 may be referred to as a RS decoder circuit 200.

The encoder circuit 100 generates the input codeword by performing RS coding on the input data.

In this embodiment, the input data includes 17 symbols (e.g., 17 data symbols), and as a result of encoding, 2 parity symbols are generated, so the input codeword includes a total of 19 symbols.

The decoder circuit 200 provides the output codeword to the encoder circuit 100 and generates the output data and the detection signal DET by referring to the two parity symbols generated correspondingly.

A parity symbol generated when the output codeword is applied to the encoder circuit 100 is referred to as a syndrome symbol, and the two syndrome symbols are indicated as syndrome #0 (or a first syndrome) and syndrome #1 (or a second syndrome), respectively.

The memory device 1 may further include other circuits for reading or writing data. These circuits may be known in the art, and thus detailed descriptions thereof may be omitted for the interest of brevity.

FIG. 2 is a block diagram showing the encoder circuit 100 according to an embodiment of the present disclosure.

The encoder circuit 100 includes a parity generator 110, a first concatenation circuit 120, a selection circuit 130, and a second concatenation circuit 140.

The parity generator 110 applies RS encoding technology to the data output from the selection circuit 130 to generate an output. In an embodiment, the output of the parity generator 110 may be parity, for example, RS parity. For example, the parity may include two parity symbols.

The selection circuit 130 selects an output of the first concatenation circuit 120 during a write operation and selects the output codeword during a read operation. The output of the first concatenation circuit 120 or the output codeword selected by the selection circuit 130 may be referred to as "selection data" in the present disclosure.

That is, during a write operation, the parity generator 110 generates parities corresponding to the input data, and during a read operation, the parity generator 110 generates syndromes corresponding to the output codeword, which includes syndrome #0 (or a first syndrome) and syndrome #1 (or a second syndrome).

The first concatenation circuit 120 concatenates padding data following the input data. In an embodiment, the padding data includes padding bits of a first value (e.g., '0'), and the number of padding bits is equal to the total number of parity bits, which is 32.

The second concatenation circuit 140 concatenates the parities following the input data to generate the input codeword.

The parity generator 110 performs a multiplication operation on a parity generating matrix (e.g., H matrix in a conventional RS coding technique) and selection data output from the selection circuit 130. Since the H matrix is known from the conventional RS coding technique or obvious in view of the teachings of the present disclosure, some of detailed descriptions thereof may not be repeated for the interest of brevity.

Figure 3A:
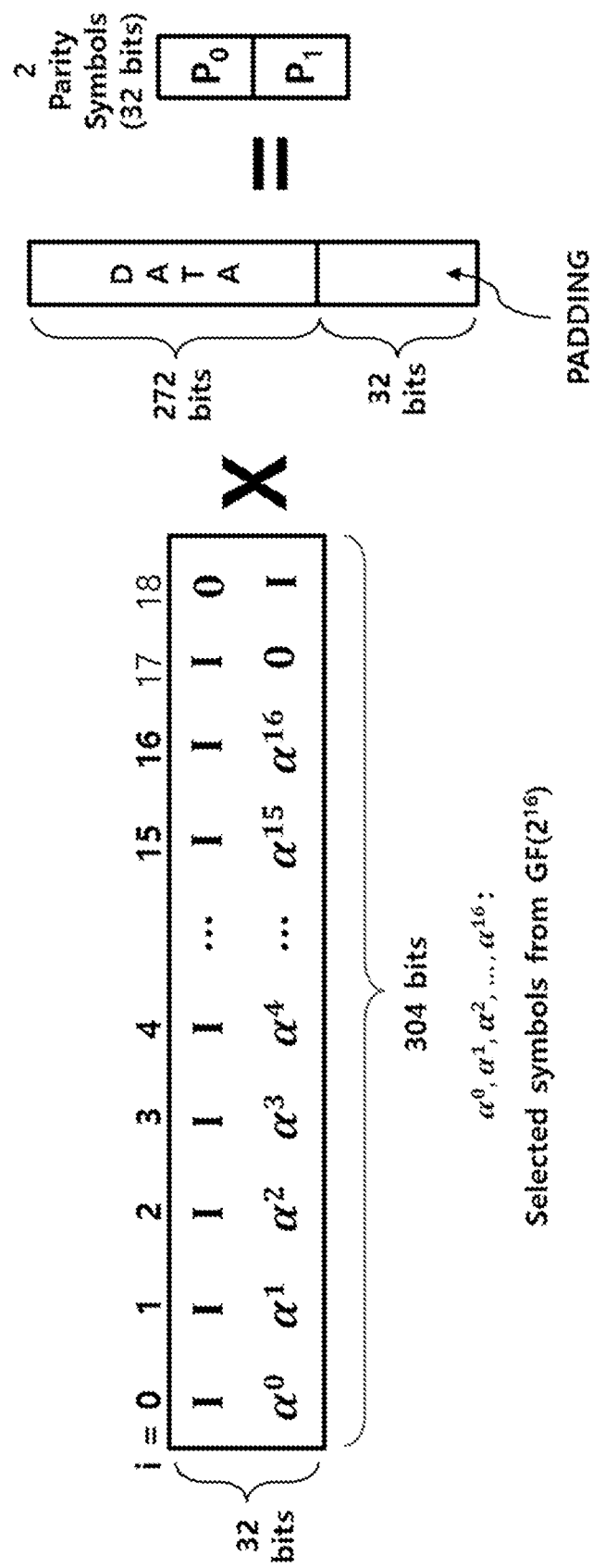
FIGS. 3A and 3B are diagrams showing an operation of a parity generator according to an embodiment of the present disclosure.
Figure 3B:
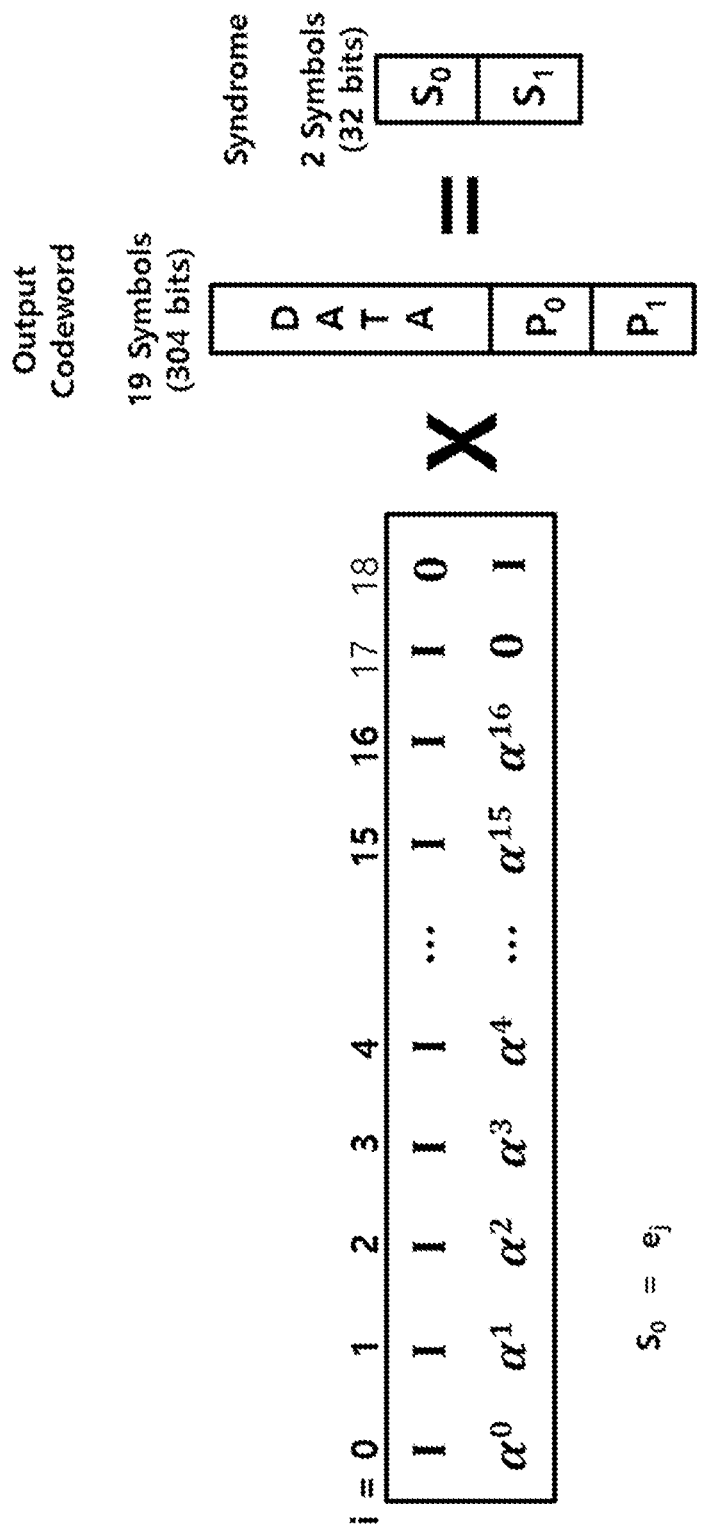

FIGS. 3A and 3B are diagrams showing operations of the parity generator 110 according to an embodiment of the present disclosure.

FIG. 3A illustrates an example of generating parities by multiplying H matrix with the selection data output from the selection circuit 130, where the selection data corresponds to concatenation of the input data and the padding data. FIG. 3B illustrates an example of generating syndromes by multiplying the H matrix with the selection data output from the selection circuit 130, where the selection data corresponds to the output codeword.

For example, $e_j$ denotes 16-bit data indicating a value of an error (or an error value). $T_j$ denotes 16-bit data indicating a location of an error (or an error location), and is a symbol where an error occurred within the output codeword. At this time, j corresponds to a value from 0 to 16.

Error value $e_j$ and error location $T_j$ are defined within the Galois field and follow operation rules in the Galois field.

Among the bits of the error value (e.g., error value vector) $e_j$, a bit corresponding to a location where an error occurred within a symbol where the error has occurred is designated as a first value (e.g., "1"), and the remaining bits each are designated as a second value (e.g., "0"). The error location (e.g., error location vector) $T_j$ is described in detail below.

The technique for generating the H matrix itself is known in the art. For example, as shown in FIGS. 3A and 3B, the H matrix has a dimension of 32×304.

In the H matrix of FIGS. 3A and 3B, I is a unit matrix with a dimension of 16×16, 0 is a zero matrix with a dimension of 16×16, and $\alpha^j$ represents a matrix with a dimension of 16×16.

The 17 matrices indicated by $\alpha^j$ at the bottom of the H matrix in FIG. 3A are determined by selecting 17 elements among the elements included in the Galois field when generating the H matrix.

FIGS. 3A and 3B illustrate the H matrix that selects $\alpha^0$, $\alpha^1$, $\alpha^2$, ..., $\alpha^{16}$ as the 17 elements.

At this time, the last row in a 16×16 matrix $\alpha^j$ corresponds to a 16-bit vector $\alpha^j$, which is a selected element in the Galois field, and the remaining upper rows of the matrix $\alpha^j$ sequentially correspond to vectors which are results of multiplications of $\alpha^j$ and $\alpha^1$, $\alpha^2$, $\alpha^3$, ..., and $\alpha^{16}$, respectively.

The error location $T_j$ is a 16-bit vector corresponding to any one of the 17 elements selected to create the H matrix as described above. Accordingly, the error location $T_j$ may indicate a location of a data symbol where an error occurred within the output codeword.

In FIG. 3A, the H matrix is multiplied with a concatenation of the input data and the padding data which includes 272 bits of input data corresponding to 17 symbols and 32 bits of padding data corresponding to 2 symbols. The result of multiplication is 2 parity symbols $P_0$ and $P_1$.

In FIG. 3B, the output codeword, which has 17 data symbols and 2 parity symbols, is multiplied with the H matrix and 2 syndrome symbols $S_1$ and $S_1$ are generated as a result of the multiplication.

Hereinafter, a parity symbol may be referred to as a parity, and a syndrome symbol may be referred to as a syndrome. For example, the parity symbol $P_0$ may be represented as parity #0 (or first parity), the parity symbol $P_1$ may be represented as parity #1 (or second parity), the syndrome symbol $S_0$ may be represented as syndrome #0 (or a first syndrome), the syndrome symbol $S_1$ may be represented as syndrome #1 (or a second syndrome).

In the RS code technique, the syndrome #0 $S_0$ corresponds to a value of an error $e_j$, and the syndrome #1 $S_1$ corresponds to a product of the error value $e_j$ and the error location $T_j$ on the Galois field.

In FIGS. 3A and 3B, the matrix operation includes a vector dot product operation of a row vector and a column vector, which includes elementwise multiplication of the two vectors and an accumulation operation on the results of the elementwise multiplication.

At this time, the accumulation operation is an operation in the Galois field and corresponds to an XOR operation on the results of the elementwise multiplication. For example, if the number of 1's in the result of the elementwise multiplication for the 16 elements is even, 0 is returned, and if the number of 1's is odd, 1 is returned.

Figure 4:
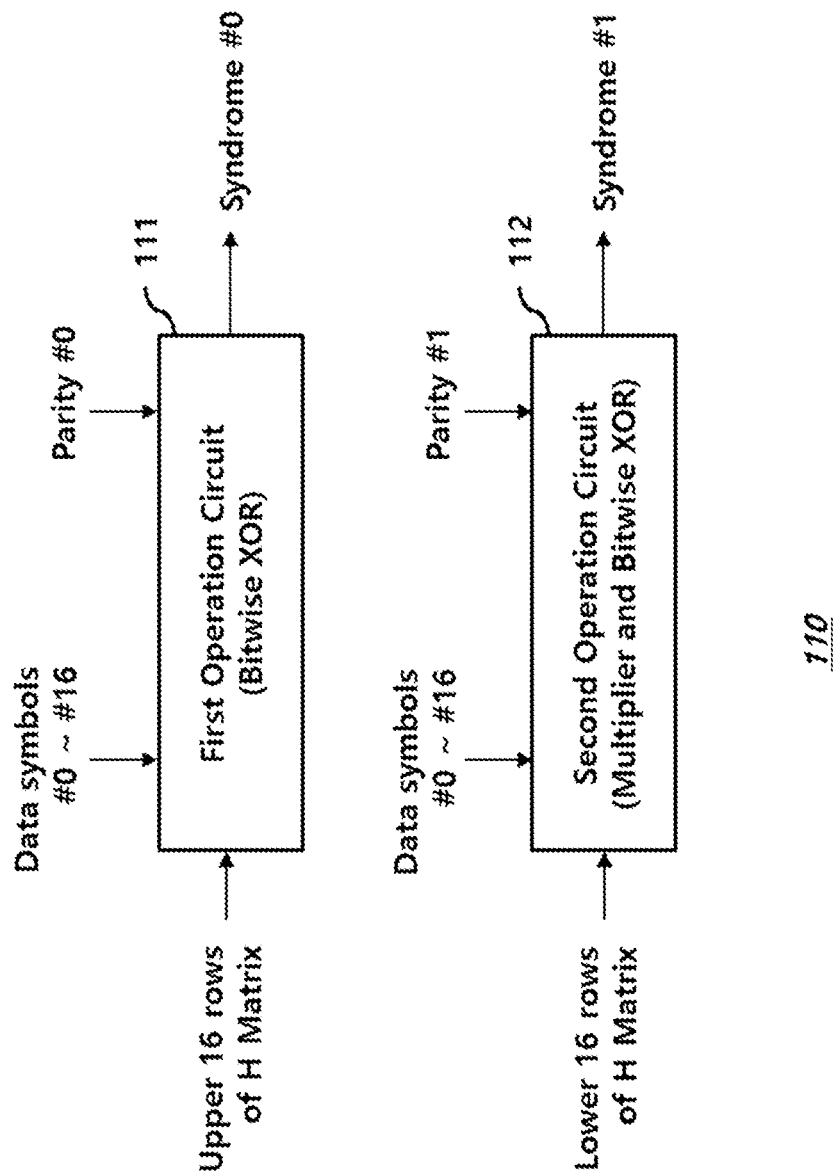
FIG. 4 illustrates a parity generator according to an embodiment of the present disclosure.

FIG. 4 is a diagram showing an operation of the parity generator 110.

The parity generator 110 includes a first operation circuit 111 and a second operation circuit 112.

The first operation circuit 111 generates the parity #0 (or first parity) and the syndrome #0 (or a first syndrome), and the second operation circuit 112 generates the parity #1 (or second parity) and the syndrome #1 (or a second syndrome).

As described above, each of the first operation circuit 111 and the second operation circuit 112 performs an inner product operation of two vectors in a Galois field, and this can be performed by a multiplier and an XOR operator.

First, a case in which the syndrome #0 is generated in the first operation circuit 111 and the syndrome #1 is generated in the second operation circuit 112 will be described.

Referring to FIG. 3B, the part of the top 16 rows of the H matrix multiplied with the last symbol of the output codeword corresponds to the zero matrix.

Accordingly, the first operation circuit 111 uses a partial H matrix excluding the 16 columns corresponding to the last symbol among the top 16 rows of the H matrix for operation. For example, the first operation circuit 111 may use a partial H matrix (e.g., 16×288 matrix), which is obtained by excluding a zero matrix (e.g., 16×16 matrix) that corresponds to the last symbol (e.g., the second parity $P_1$) from an upper portion (e.g., 16×304 matrix) of the H matrix (e.g., 32×304 matrix).

Additionally, the first operation circuit 111 uses 17 data symbols and the parity #0 to calculate the syndrome #0.

However, the top 16 rows of the H matrix are a list of unit matrices. Accordingly, the syndrome #0 can be created by omitting the multiplication operation and performing only the bitwise XOR operation on the 17 data symbols and the parity #0.

Referring to FIG. 3B, the part of the lower 16 rows of the H matrix multiplied with the second to last symbol of the output codeword corresponds to the 0 matrix.

Accordingly, the second operation circuit 112 uses a partial H matrix excluding the 16 columns corresponding to the second to last symbol among the lower 16 rows of the H matrix. For example, the second operation circuit 112 may use a partial H matrix (e.g., 16×288 matrix), which is obtained by excluding a zero matrix (e.g., 16×16 matrix) that corresponds to the second to last symbol (e.g., the first parity $P_0$) from a lower portion (e.g., 16×304 matrix) of the H matrix (e.g., 32×304 matrix).

Additionally, the second operation circuit 112 uses 17 data symbols and the parity #1 to calculate the syndrome #1.

Generating the parity #0 (or a first parity) in the first operation circuit 111 and the parity #1 (or a second parity) in the second operation circuit 112 can be understood from FIG. 3A and the above descriptions with reference to FIG. 3B, so detailed descriptions thereof have been omitted herein for the interest of brevity.

Figure 5:
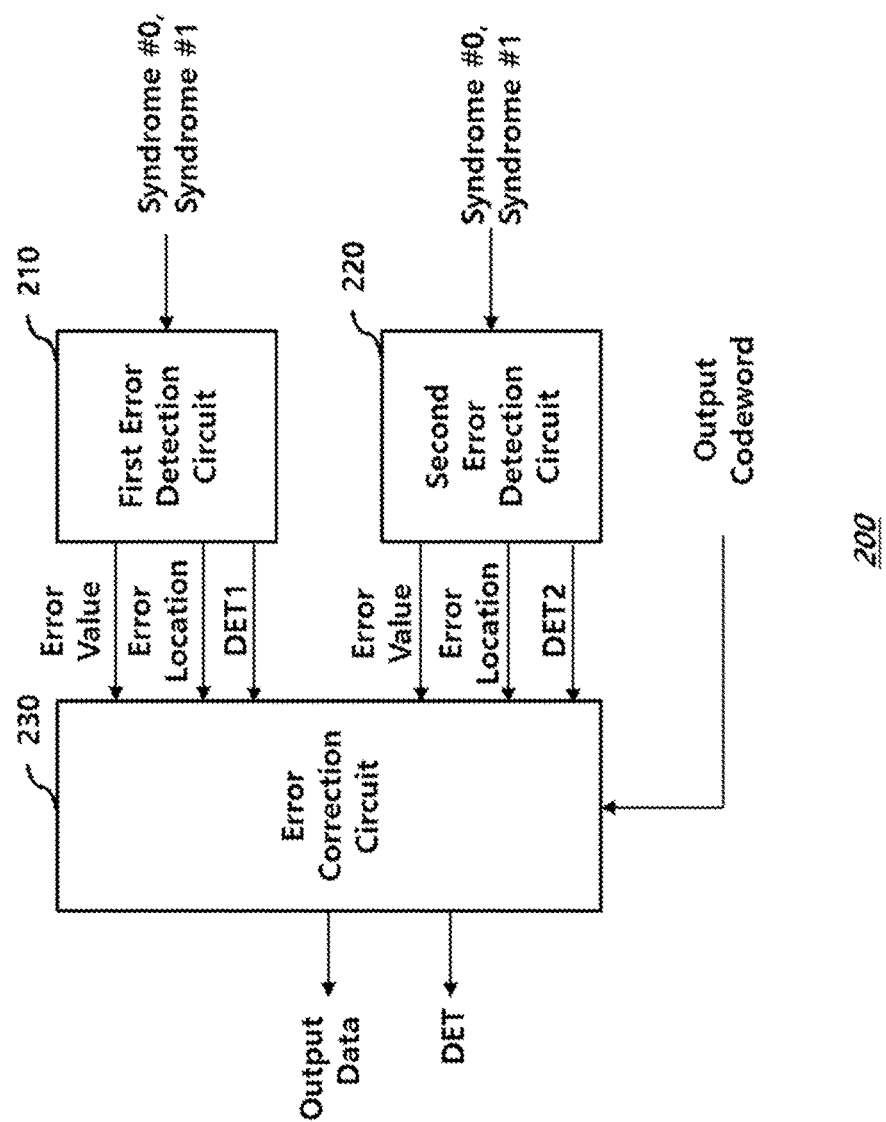
FIG. 5 illustrates a decoder circuit according to an embodiment of the present disclosure.

FIG. 5 is a block diagram showing a decoder circuit 200 according to an embodiment of the present disclosure.

Correcting an error occurring within a single symbol (or a 1-symbol error) may be performed using a conventional RS code technology.

In addition to this conventional technology, the present disclosure provides a RS code technology that can additionally correct a 2-bit error exceeding one symbol boundary without increasing parity bits.

The decoder circuit 200 includes a first error detection circuit 210, a second error detection circuit 220, and an error correction circuit 230.

Since the first error detection circuit 210 detects a 1-symbol error according to a conventional RS decoder circuit, a detailed description thereof will be omitted herein for the interest of brevity.

That is, when the first error detection circuit 210 detects a 1-symbol error using the syndrome #0 and the syndrome #1, it provides an error value and an error location to the error correction circuit 230, and the error correction circuit 230 provides the output data which is corrected accordingly.

When the first error detection circuit 210 detects 1-symbol error, it activates a first detection signal DET1.

Since it is a conventional technology to correct a 1-symbol error in the error correction circuit 230 according to the error value and error location, detailed description thereof will be omitted herein for the interest of brevity.

The second error detection circuit 210 detects a 2-bit error exceeding one symbol boundary as described above.

A 2-bit error exceeding one symbol boundary represents two 1-bit errors occurring in two different symbols, respectively. Hereinafter, a 2-bit error exceeding one symbol boundary may be referred to as an out-of-boundary 2-bit error.

If an out-of-boundary 2-bit error occurs in the output codeword, it may correspond to one of the following four types:

(Type 1) Two 1-bit errors occurring in two data symbols, respectively;

(Type 2) Two 1-bit errors occurring in a data symbol and the parity (or first parity) #0, respectively;

(Type 3) Two 1-bit errors occurring in a data symbol and the parity (or second parity) #1, respectively; and (Type 4) Two 1-bit errors occurring in the parity #0 and the parity #0, respectively.

Type 1 (or a first type) involves selecting 2 symbols out of 17 data symbols, so there are 136 cases. Each of type 2 and type 3 involves selecting 1 symbol out of 17 data symbols, so there are 17 cases. There is only one case in the type 4.

Correcting an error for type 4 may be unnecessary, when an error occurs only in parity symbols. In these embodiments, if one of the 170 cases corresponding to type 1, type 2, and type 3 occurs, it is determined as an out-of-boundary 2-bit error and such an error is corrected accordingly.

In type 1, the syndrome #0 (or the first syndrome $S_0$) and the syndrome #1 (or the second syndrome $S_1$) can be expressed as Equation 1.

$$S_0 = e_{j1} + e_{j2}$$
$$S_1 = e_{j1}T_{j1} + e_{j2}T_{j2}$$ [Equation 1]

In Equation 1, $e_{j1}$ represents an error value in a first data symbol, and $T_{j1}$ represents a location of the first data symbol where an error occurred. Additionally, $e_{j2}$ represents an error value in a second data symbol and $T_{j2}$ represents a location of the second data symbol where an error occurred.

In this embodiment, both the error value and the error location are 16-bit vectors, and their addition and multiplication are defined in the Galois field.

For example, in Equation 1, addition of two vectors corresponds to a bitwise XOR operation, and multiplication of two vectors corresponds to Galois field multiplication.

Accordingly, if the error values of the two errors in type 1 are the same, the number of 1's in the syndrome #0 is 0, and if the error values of the two errors are different, the number of 1's in the syndrome #0 is 2.

The syndrome #0 and the syndrome #1 corresponding to type 2 (or a second type) can be expressed as Equation 2.

$$S_0 = e_{j1} + e_{j2}$$
$$S_1 = e_{j1}T_{j1}$$ [Equation 2]

As in type 1, if the error values of the two errors in type 2 are the same, the number of 1's in the syndrome #0 is 0, and if the error values of the two errors are different, the number of 1's in the syndrome #0 is 2.

The syndrome #0 and the syndrome #1 corresponding to type 3 can be expressed as Equation 3.

$$S_0 = e_{j1}$$
$$S_1 = e_{j1}T_{i1} + e_{j2}$$ [Equation 3]

In type 3 (or a third type), the number of 1's in the syndrome #0 becomes 1.

The syndrome #0 and the syndrome #1 corresponding to type 4 can be expressed as Equation 4.

$$S_0 = e_{j1}$$
$$S_1 = e_{j2}$$ [Equation 4]

In type 4 (or a fourth type), the number 1's in the syndrome #0 becomes 1.

The above descriptions may be summarized as Table 1 below.

TABLE 1

| Type (number of cases) | Number of 1-bit errors per symbol | | | | Number of 1's in the syndrome #0 | Necessity of error correction |
| --- | --- | --- | --- | --- | --- | --- |
| | One data symbol | Another data symbol | Parity #0 | Parity #1 | | |
| 1 (136) | 1 | 1 | 0 | 0 | 0 or 2 | necessary |
| 2 (17) | 1 | 0 | 1 | 0 | 0 or 2 | necessary |
| 3 (17) | 1 | 0 | 0 | 1 | 1 | necessary |
| 4 (1) | 0 | 0 | 1 | 1 | 1 | unnecessary |

In this embodiment, when the output codeword and the syndrome #0 and the syndrome #1 are generated, they are used to determine one of the 170 cases and an error value and an error location is determined accordingly.

Figure 6:
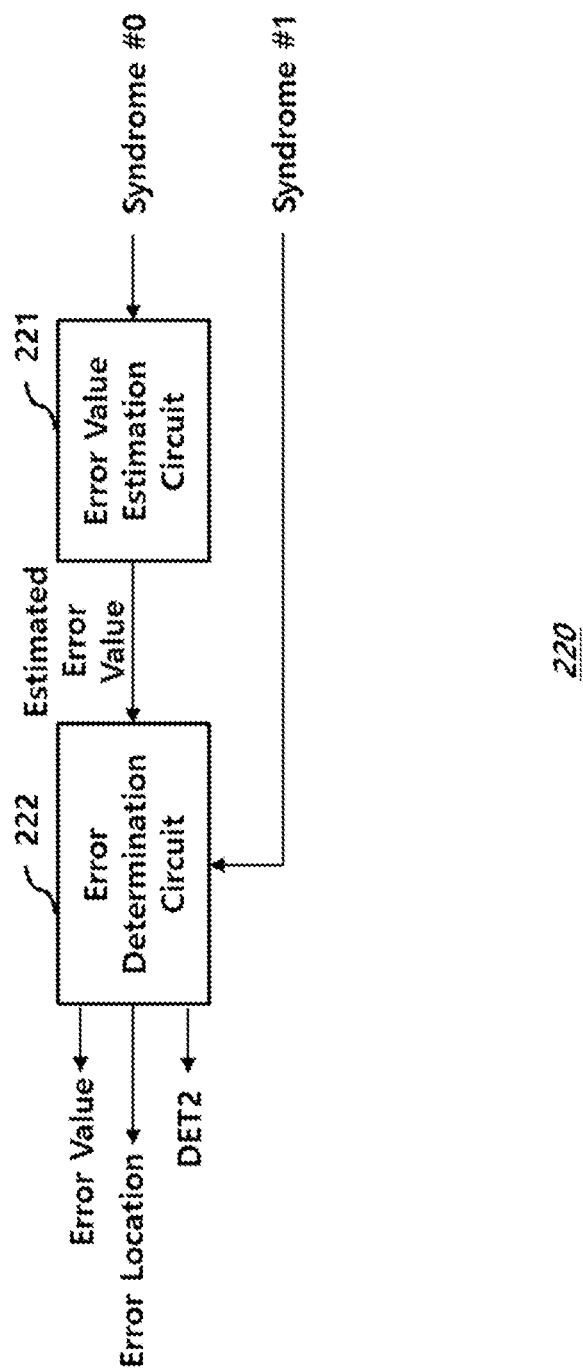
FIG. 6 illustrates a second error detection circuit according to an embodiment of the present disclosure.

FIG. 6 is a block diagram showing the second error detection circuit 220 according to an embodiment of the present disclosure.

The second error detection circuit 220 includes an error value estimation circuit 221 and an error determination circuit 222.

The error value estimation circuit 221 receives the syndrome #0 and estimates which type of an error occurred according to the principle described above. For example, the error value estimation circuit 221 may generate the estimated error value based on the number of a given logic value (e.g., a logic high value "1") in the first syndrome (or the syndrome #0).

Figure 7:
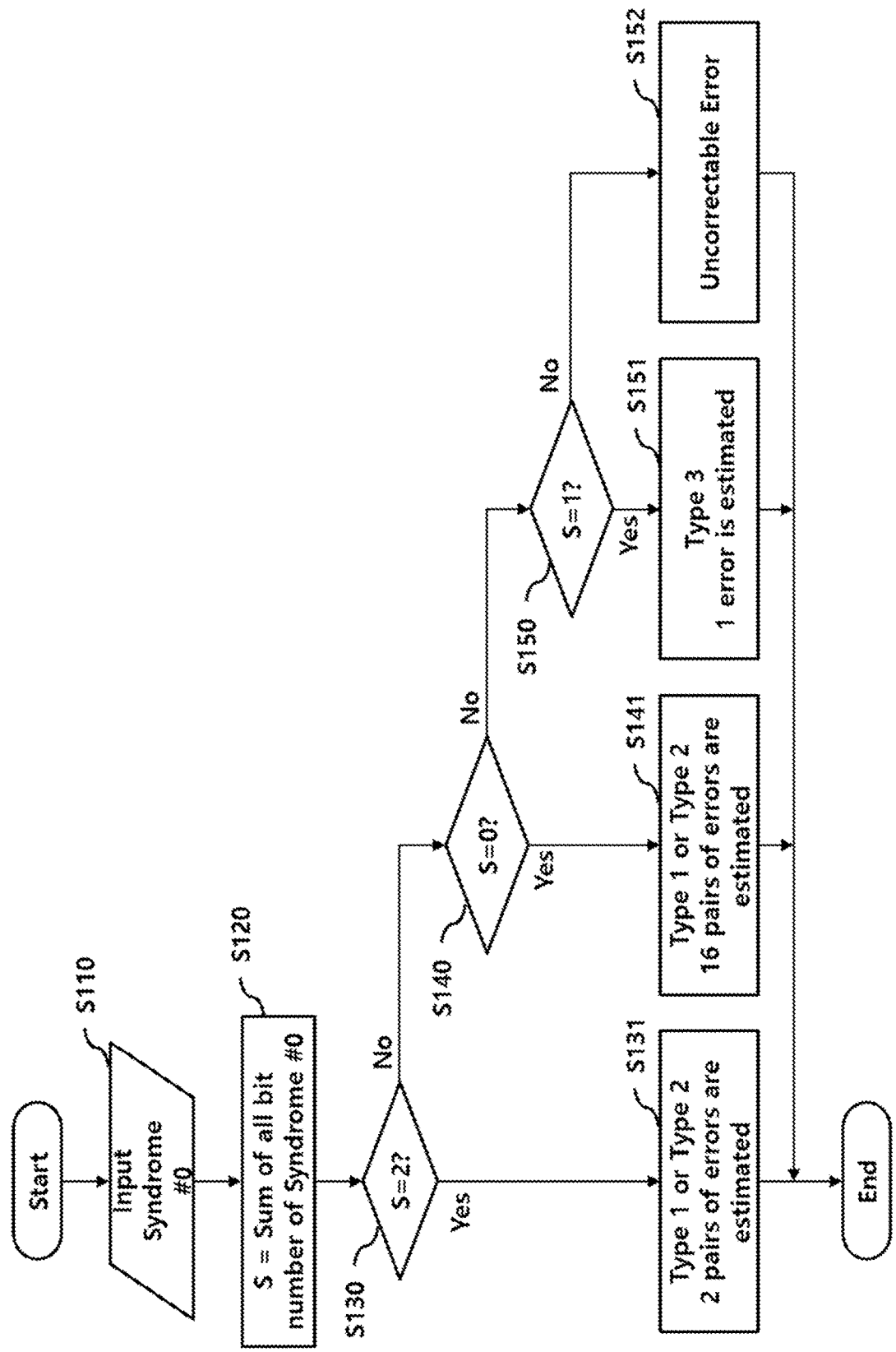
FIG. 7 is a flowchart showing an operation of an error value estimation circuit according to an embodiment of the present disclosure.

FIG. 7 is a flowchart showing an operation of the error value estimation circuit 221 according to an embodiment of the present disclosure.

First, syndrome #0 is input at S110, and the number of 1's included in the syndrome #0, that is, a sum S of all bits of the syndrome #0, is obtained at S120.

Afterwards, it is determined whether S is 2 at S130, and if S is 2, it is estimated that a type 1 error or a type 2 error has occurred at S131. A type 1 may be referred to as a first type, a type 2 may be referred to as a second type, and a type 3 may be referred to as a third type.

The case where S is 2 corresponds to a case where errors of different error values occurred.

For example, if the syndrome #0 (or $S_0$) is "1000 . . . 0001," two pairs of errors with the error values (or two pairs of the estimated error value) of "1000 . . . 0000" and "0000 . . . 0001", respectively, can be estimated as follows:

$$e_{j1} = \text{"1000 ... 0000"}, e_{j2} = \text{"0000 ... 0001"}; \text{and}$$
$$e_{j1} = \text{"0000 ... 0001"}, e_{j2} = \text{"1000 ... 0000."}$$

If S is not 2, it is determined whether S is 0 at S140. If S is 0, it is estimated that a type 1 error or a type 2 error has occurred at S141.

When S is 0, it corresponds to a case where an error of the same value occurs. In this embodiment, because the syndrome #0 has 16 bits, 16 pairs of error values (or 16 pairs of the estimated error value) can be estimated as follows.

$$e_{j1} = \text{"1000 ... 0000"}, e_{j2} = \text{"1000 ... 0000"};$$
$$e_{j1} = \text{"0100 ... 0000"}, e_{j2} = \text{"0100 ... 0000"};$$

...

-continued $e_{j1}$ = "0000 ... 0010", $e_{j2}$ = "0000 ... 0010"; and $e_{j1}$ = "0000 ... 0001", $e_{j2}$ = "0000 ... 0001."

If S is not 0, it is determined whether S is 1 at S150. If S is 1, it is estimated that a type 3 error has occurred at S151.

If S is 1, the syndrome #0 can be estimated as the error value. In other words, if S is 1, a single error value that is the same as the syndrome #0 is estimated.

If S is not 1, it is determined that an error that cannot be corrected (or an uncorrectable error) has occurred at S152. In this case, the error value cannot be estimated.

Figure 8:
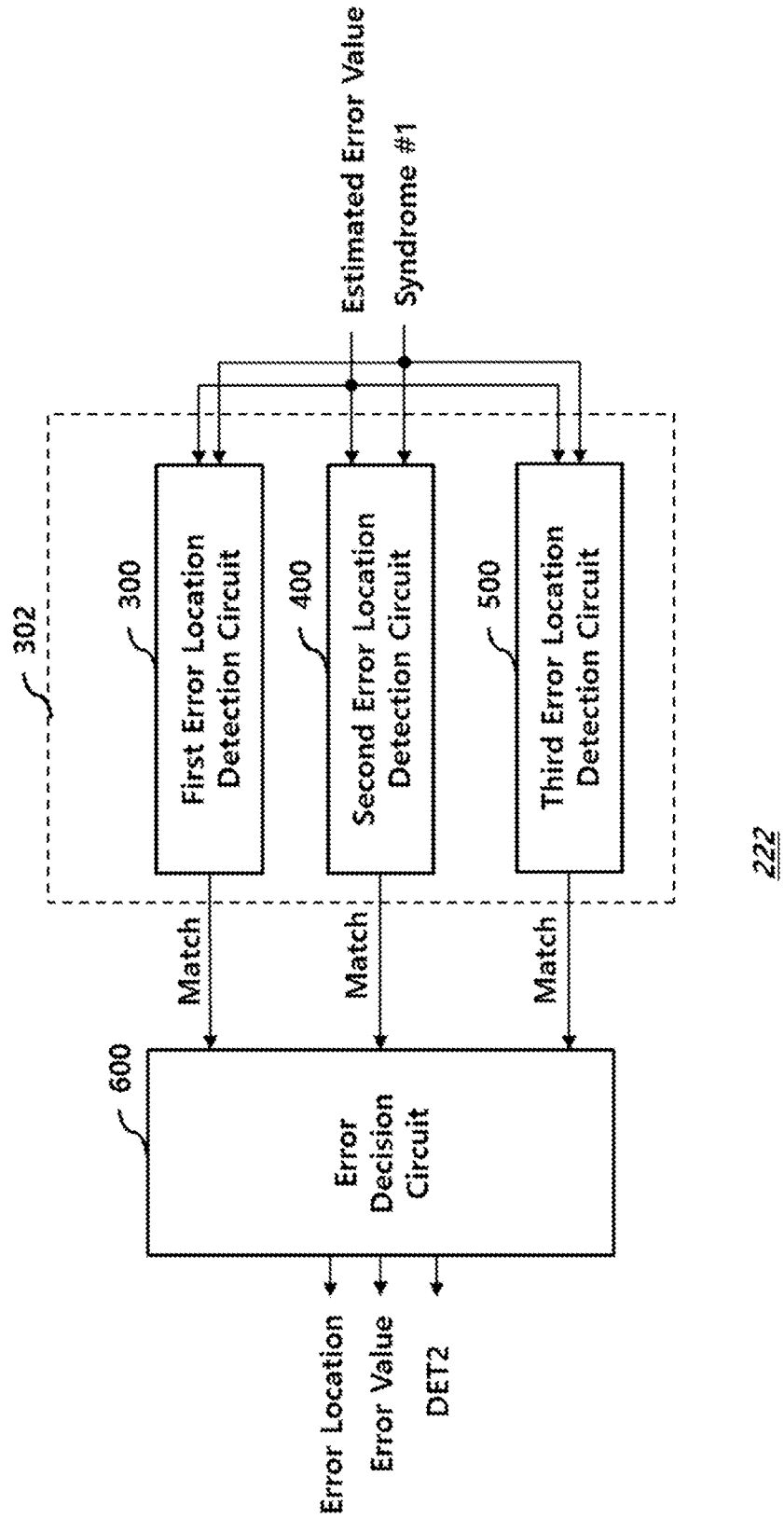
FIG. 8 illustrates an error determination circuit according to an embodiment of the present disclosure.

FIG. 8 is a block diagram showing an error determination circuit 222 according to an embodiment of the present disclosure.

The error determination circuit 222 in FIG. 8 detects an out-of-boundary 2-bit error based on the estimated error value and the syndrome #1 (or second syndrome) to provide an error value and an error location. In an embodiment, the error determination circuit 222 includes an error location detection circuit 302 and an error decision circuit 600. The error location detection circuit 302 may determine a match of an out-of-boundary 2-bit error to a specific type based on an estimated error value and the second syndrome #1. In the embodiment of FIG. 8, the error location detection circuit 302 includes a first error location detection circuit 300, a second error location detection circuit 400, and a third error location detection circuit 500.

The first error location detection circuit 300 receives the syndrome #1 and the estimated error value and determines whether they corresponds to type 1. In other words, the first error location detection circuit 300 determines whether an out-of-boundary 2-bit error corresponds to the first type (type 1). When the first error location detection circuit 300 determines that an out-of-boundary 2-bit error corresponds to the first type (type 1), the first error location detection circuit 300 generates one or more output signals MATCH having a given logic value (e.g., a logic high value) indicative of a match of the out-of-2-bit error to the first type.

The second error location detection circuit 400 receives the syndrome #1 and the estimated error value and determines whether they corresponds to type 2. In other words, the second error location detection circuit 400 determines whether an out-of-boundary 2-bit error corresponds to the second type (type 2). When the second error location detection circuit 400 determines that an out-of-boundary 2-bit error corresponds to the second type (type 2), the second error location detection circuit 400 generates one or more output signals MATCH having a given logic value (e.g., a logic high value) indicative of a match of the out-of-2-bit error to the second type.

The third error location detection circuit 500 receives the syndrome #1 and the estimated error value and determines whether they corresponds to type 3. In other words, the third error location detection circuit 500 determines whether an out-of-boundary 2-bit error corresponds to the third type (type 3). When the third error location detection circuit 500 determines that an out-of-boundary 2-bit error corresponds to the third type (type 3), the third error location detection circuit 500 generates an output signal MATCH having a given logic value (e.g., a logic high value) indicative of a match of the out-of-2-bit error to the third type.

The error decision circuit 600 outputs the error value and error location determined according to outputs of the first error location detection circuit 300, the second error location detection circuit 400, and the third error location detection circuit 500.

The error decision circuit 600 activates the second detection signal DET2 when the error corresponds to any one of types 1 to 3.

Figure 9:
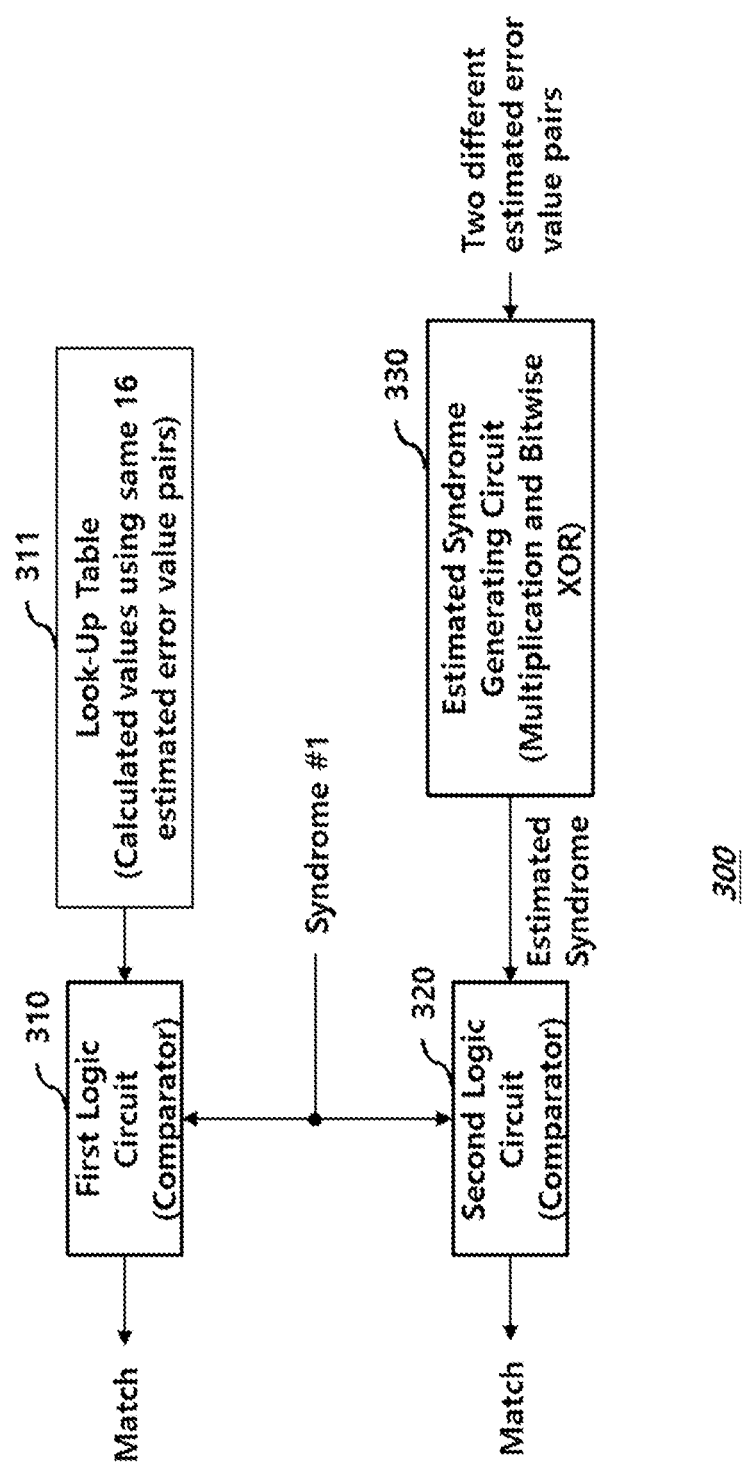
FIG. 9 illustrates a first error location detection circuit according to an embodiment of the present disclosure.

FIG. 9 is a block diagram showing a first error location detection circuit 300 according to an embodiment of the present disclosure.

The first error location detection circuit 300 includes a first logic circuit 310, a second logic circuit 320, and an estimated syndrome generating circuit 330.

The first logic circuit 310 compares a plurality of calculated values using the same 16 pairs of estimated error values with the syndrome #1.

If the estimated error values are the same, the syndrome #1 in Equation 1 is expressed as Equation 5:

$$S_1 = e_{j1}(T_{j1} + T_{j2}).$$ [Equation 5]

Because the right side of Equation 5 is not affected by the value of the syndrome #0, the plurality of calculated values using the 16 pairs of estimated error values and all possible combinations of error positions ($T_{j1}$, $T_{j2}$) can be stored in the look-up table 311.

The first logic circuit 310 compares the syndrome #1 and the plurality of calculated values stored in the look-up table 311 to determine whether there is a match. For example, when the syndrome #1 and one of the plurality of calculated values stored in the look-up table 311 match, the first logic circuit 310 generates an output signal MATCH having a given value (e.g. a logic high value) that indicates a match therebetween.

If there is a match, the error decision circuit 600 can determine corresponding error values ($e_{j1}$, $e_{j2}$) and error locations ($T_{j1}$, $T_{j2}$), and activates the second detection signal DET2.

If the estimated error values are not the same, the second logic circuit 320 compares the syndrome #1 and the estimated syndrome to determine whether they match.

The estimation syndrome generating circuit 330 generates an estimated syndrome from two pairs of different estimated error values.

As described above, two pairs of error values ($e_{j1}$, $e_{j2}$) can be estimated from the syndrome #0.

The estimated syndrome generation circuit 330 may generate a plurality of estimated syndromes corresponding to the syndrome #1 by calculating two pairs of estimated error values ($e_{j1}$, $e_{j2}$) and various combinations of error locations ($T_{j1}$, $T_{j2}$) according to Equation 1.

The estimated syndrome generating circuit 330 performs multiplication and bitwise XOR operations in this process.

The second logic circuit 320 compares the plurality of estimated syndromes with the syndrome #1 and determines whether they match. For example, when the syndrome #1 and one of the plurality of estimated syndromes match, the second logic circuit 320 generates an output signal MATCH having a given value (e.g. a logic high value) that indicates a match therebetween.

If there is a match, the error decision circuit 600 can determine corresponding error values ($e_{j1}$, $e_{j2}$) and error locations ($T_{j1}$, $T_{j2}$), and activates the second detection signal DET2.

Figure 10:
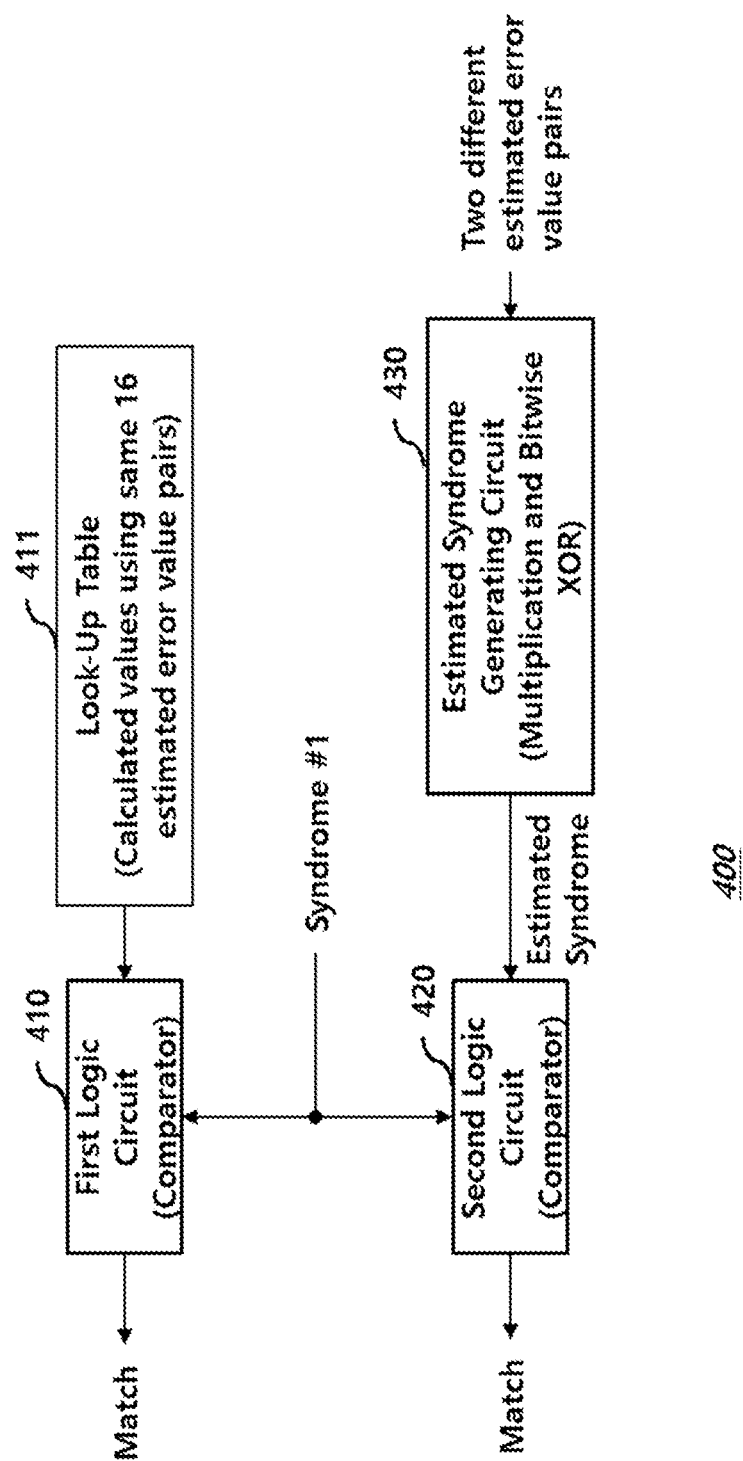
FIG. 10 illustrates a second error location detection circuit according to an embodiment of the present disclosure.

FIG. 10 is a block diagram showing a second error location detection circuit 400 according to an embodiment of the present disclosure.

The second error location detection circuit 400 has substantially the same structure as the first error location detection circuit 300.

The second error location detection circuit 300 includes a first logic circuit 410, a second logic circuit 420, and an estimated syndrome generating circuit 430.

The first logic circuit 410 determines whether there is a match by comparing a plurality of calculated values using the syndrome #1 and 16 pairs of the same estimated error values.

If the estimated error values are the same, the right side of Equation 2 is not affected by the syndrome #0, so 16 pairs of the estimated error values and the plurality of calculated, values using all possible error locations $T_{j1}$ can be stored in the look-up table 411.

The first logic circuit 410 compares the syndrome #1 and the plurality of calculated values to determine whether there is a match. For example, when the syndrome #1 and one of the plurality of calculated values stored in the look-up table 411 match, the first logic circuit 410 generates an output signal MATCH having a given value (e.g. a logic high value) that indicates a match therebetween.

If there is a match, the error location decision circuit 600 determines corresponding error location $T_{j1}$ and activates the second detection signal DET2.

If the estimated error values are not the same, the second logic circuit 420 compares the syndrome #1 and an estimated syndrome to determine whether they match.

The estimated syndrome generating circuit 430 generates the estimated syndrome from two pairs of different estimated error values.

As described above, two pairs of error values ($e_{j1}$, $e_{j2}$) can be estimated from the syndrome #0.

The estimated syndrome generating circuit 430 may generate a plurality of estimated syndromes corresponding to the syndrome #1 by calculating two pairs of estimated error values and various combinations of error locations ($T_{j1}$, $T_{j2}$) according to Equation 2.

The estimated syndrome generating circuit 430 performs multiplication and bitwise XOR operations in this process.

The second logic circuit 420 compares the plurality of estimated syndromes with the syndrome #1 and determines whether they match. For example, when the syndrome #1 and one of the plurality of estimated syndromes match, the second logic circuit 420 generates an output signal MATCH having a given value (e.g. a logic high value) that indicates a match therebetween.

If there is a match, the error decision circuit 600 can determine corresponding error values ($e_{j1}$, $e_{j2}$) and error locations ($T_{j1}$, $T_{j2}$), and activates the second detection signal DET2.

FIG. 11 is a block diagram showing a third error location detection circuit 500 according to an embodiment of the present disclosure.

The third error location detection circuit 500 includes a logic circuit 510 and an estimated syndrome generating circuit 520.

The third logic circuit 510 compares the syndrome #1 and an estimated syndrome to determine whether they match.

The estimated syndrome generating circuit 520 generates the estimated syndrome from an estimated error value which is the same as the syndrome #0.

The estimated syndrome generating circuit 520 combines the estimated error value with the 16 error values $e_{j2}$ and possible error locations $T_{j1}$ and operates according to Equation 3 to generate a plurality of estimated syndromes corresponding to the syndrome #1.

The estimated syndrome generating circuit 420 performs multiplication and bitwise XOR operations in this process.

The third logic circuit 510 compares the plurality of estimated syndromes with the syndrome #1 and determines whether they match. For example, when the syndrome #1 and one of the plurality of estimated syndromes match, the third logic circuit 510 generates an output signal MATCH having a given value (e.g. a logic high value) that indicates a match therebetween.

If there is a match, the error decision circuit 600 can determine corresponding error value $e_{j1}$ and error location $T_{j1}$, and activates the second detection signal DET2.

Returning to FIG. 5, the error correction circuit 230 generates output data according to the output codeword, error value, and error location.

When both the first detection signal DET1 and the second detection signal DET2 are deactivated, it is considered that no error has been detected, and the data included in the output codeword is provided as the output data as is.

When the first detection signal DET1 is activated, correction data is generated by reflecting the error value and the error location output from the first error detection circuit 210.

This is the same as the 1-symbol error correction using the conventional RS code technology.

When the second detection signal DET2 is activated, correction data is generated by additionally reflecting the error value and the error location output from the second error detection circuit 220.

This corresponds to correcting a 1-bit error present in one or two data symbols as described above. For example, when the second detection signal DET2 is activated to have a given logic value (e.g., a logic high value), the error correction circuit 230 may correct an out-of-boundary 2-bit error on the output codeword according to embodiments of the present disclosure and provide the corrected data as the output data. As a result, a coding circuit according to an embodiment of the present disclosure including the second error detection circuit 220 and the error correction circuit 230 can perform an out-of-boundary 2-bit error correction as well as a 1-symbol error correction without increasing parity bits, thereby preventing a significant increase of the circuit area.

The detection signal DET is activated when the first detection signal DET1 or the second detection signal DET2 is activated.

Although various embodiments have been illustrated and described, various changes and modifications may be made to the described embodiments without departing from the spirit and scope of the invention as defined by the following claims.

What is claimed is:

1. A coding circuit comprising:
an encoder circuit configured to generate parity by applying input data to a parity generating matrix and generate input codeword by concatenating the input data and the parity; and
a decoder circuit configured to detect and correct an out-of-boundary 2-bit error using syndromes, the out-of-boundary 2-bit error corresponding to two 1-bit errors occurred at two symbols respectively among a plurality of symbols included in output codeword, the syndromes being generated by applying the output codeword to the parity generating matrix.

2. The coding circuit of claim 1, wherein the encoder circuit comprises:
a first concatenation circuit configured to concatenate the input data and padding data;
a selection circuit configured to select an output of the first concatenation circuit or the output codeword;
a parity generator configured to apply an output of the selection circuit to the parity generating matrix; and
a second concatenation circuit configured to generate the input codeword by concatenating the input data and an output of the parity generator.

3. The coding circuit of claim 2, wherein the selection circuit selects the output of the first concatenation circuit during a write operation and selects the output codeword during a read operation and the parity generator generates the syndromes during the read operation.

4. The coding circuit of claim 1, wherein the decoder circuit includes:
a first error detection circuit configured to detect a 1-symbol error using the syndromes, the 1-symbol error including an error occurred in a single symbol among a plurality of symbols included in the output codeword;
a second error detection circuit configured to detect the out-of-boundary 2-bit error using the syndromes; and
an error correction circuit configured to provide output data by correcting an error in the output codeword based on detection results of the first error detection circuit and the second error detection circuit.

5. The coding circuit of claim 4, wherein the second error detection circuit includes:
an error value estimation circuit configured to generate an estimated error value by estimating errors based on a first syndrome among the syndromes; and
an error determination circuit configured to provide an error value and an error location by detecting the out-of-boundary 2-bit error based on the estimated error value and a second syndrome among the syndromes.

6. The coding circuit of claim 5, wherein the error value estimation circuit generates the estimated error value based on the number of a given logic value included in the first syndrome.

7. The coding circuit of claim 6, wherein the error determination circuit includes:
an error location detection circuit configured to determine a match of the out-of-boundary 2-bit error to a specific type based on the estimated error value and the second syndrome; and
an error decision circuit configured to decide the error location and the error value based on the match.

8. The coding circuit of claim 7, wherein the type includes a first type corresponding to two 1-bit errors occurring in two data symbols respectively, a second type corresponding to two 1-bit errors occurring in a single data symbol and first parity respectively, and a third type corresponding to two 1-bit errors occurring in a single data symbol and second parity respectively, and
wherein the error location detection circuit includes:
a first error location detection circuit configured to determine whether the out-of-boundary 2-bit error corresponds to the first type;
a second error location detection circuit configured to determine whether the out-of-boundary 2-bit error corresponds to the second type; and
a third error location detection circuit configured to determine whether the out-of-boundary 2-bit error corresponds to the third type.

9. The coding circuit of claim 8, wherein each of the first and second error location detection circuits generates a plurality of estimated syndromes corresponding to the second syndrome, and compares the second syndrome with the plurality of estimated syndromes and a plurality of calculated values to generate one or more output signals each indicating the match, the plurality of calculated values being stored in a look-up table.

10. The coding circuit of claim 8, wherein the third error location detection circuit generates a plurality of estimated syndromes corresponding to the second syndrome, and compares the second syndrome with the plurality of estimated syndromes to generate an output signal indicating the match.

11. A memory device comprising:
a memory cell array; and
a coding circuit configured to provide input codeword to the memory cell array by encoding input data, and to generate output data and a detection signal by decoding output codeword output from the memory cell array,
wherein the coding circuit includes:
an encoder circuit configured to generate parity by applying the input data to a parity generating matrix and generate the input codeword by concatenating the input data and the parity; and
a decoder circuit configured to detect and correct an out-of-boundary 2-bit error using syndromes, the out-of-boundary 2-bit error corresponding to two 1-bit errors occurred at two symbols respectively among a plurality of symbols included in the output codeword, the syndromes being generated by applying the output codeword to the parity generating matrix.

12. The memory device of claim 11, wherein the encoder circuit further comprises:
a first concatenation circuit configured to concatenate the input data and padding data;
a selection circuit configured to select an output of the first concatenation circuit or the output codeword;
a parity generator configured to apply an output of the selection circuit to the parity generating matrix; and
a second concatenation circuit configured to generate the input codeword by concatenating the input data and an output of the parity generator.

13. The memory device of claim 12, wherein the selection circuit selects the output of the first concatenation circuit during a write operation and selects the output codeword during a read operation and the parity generator generates the syndromes during the read operation.

14. The memory device of claim 11, wherein the decoder circuit includes:
a first error detection circuit configured to detect a 1-symbol error using the syndromes, the 1-symbol error including an error occurred in a single symbol among a plurality of symbols included in the output codeword;
a second error detection circuit configured to detect the out-of-boundary 2-bit error using the syndromes; and
an error correction circuit configured to provide output data by correcting an error in the output codeword based on detection results of the first error detection circuit and the second error detection circuit.

15. The memory device of claim 14, wherein the second error detection circuit includes:
an error value estimation circuit configured to generate an estimated error value by estimating errors based on a first syndrome among the syndromes; and
an error determination circuit configured to provide an error value and an error location by detecting the out-of-boundary 2-bit error based on the estimated error value and a second syndrome among the syndromes.

16. The memory device of claim 15, wherein the error value estimation circuit generates the estimated error value based on the number of a given logic value included in the first syndrome.

17. The memory device of claim 16, wherein the error determination circuit includes:
an error location detection circuit configured to determine a match of the out-of-boundary 2-bit error to a specific type based on the estimated error value and the second syndrome; and
an error decision circuit configured to decide the error location and the error value based on the match.

18. The memory device of claim 17, wherein the type includes a first type corresponding to two 1-bit errors occurring in two data symbols respectively, a second type corresponding to two 1-bit errors occurring in a single data symbol and first parity respectively, and a third type corresponding to two 1-bit errors occurring in a single data symbol and second parity respectively, and
wherein the error location detection circuit includes:
a first error location detection circuit configured to determine whether the out-of-boundary 2-bit error corresponds to the first type;
a second error location detection circuit configured to determine whether the out-of-boundary 2-bit error corresponds to the second type; and
a third error location detection circuit configured to determine whether the out-of-boundary 2-bit error corresponds to the third type.

19. The memory device of claim 18, wherein each of the first and second error location detection circuits generates a plurality of estimated syndromes corresponding to the second syndrome, and compares the second syndrome with the plurality of estimated syndromes and a plurality of calculated values to generate one or more output signals each indicating the match, the plurality of calculated values being stored in a look-up table.

20. The memory device of claim 18, wherein the third error location detection circuit generates a plurality of estimated syndromes corresponding to the second syndrome, and compares the second syndrome with the plurality of estimated syndromes to generate an output signal indicating the match.

* * * * *